United States Patent [19]

Brownlee

[11] Patent Number: 4,963,933
[45] Date of Patent: Oct. 16, 1990

[54] LED ILLUMINATOR BAR FOR COPIER

[75] Inventor: Kenneth G. Brownlee, San Jose, Calif.

[73] Assignee: Hewlett-Packard Company, Palo Alto, Calif.

[21] Appl. No.: 253,714

[22] Filed: Oct. 5, 1988

[51] Int. Cl.$^5$ .................................. G03G 21/00
[52] U.S. Cl. .................................. 355/218; 355/229; 355/70; 250/553; 362/800
[58] Field of Search ............... 355/1, 218, 228, 229, 355/237, 238, 67, 70; 350/96.1, 96.28; 250/552, 553; 362/800

[56] References Cited

U.S. PATENT DOCUMENTS

| | | | |
|---|---|---|---|
| 4,255,042 | 3/1981 | Armitage et al. | 355/218 |
| 4,344,691 | 8/1982 | Grant et al. | 355/1 |
| 4,435,064 | 3/1984 | Tsukada et al. | 355/1 |
| 4,552,447 | 11/1985 | Sagara et al. | 355/218 |
| 4,576,464 | 3/1986 | Sakata et al. | 355/218 |
| 4,585,330 | 4/1986 | Yamamoto et al. | 355/218 |
| 4,611,906 | 9/1986 | Iwaki | 355/218 |
| 4,640,601 | 2/1987 | DeGuchi et al. | 355/218 |
| 4,720,729 | 1/1988 | Watanabe | 355/218 |
| 4,728,982 | 3/1988 | Takemura | 355/218 |
| 4,734,734 | 3/1988 | Yano | 355/218 |
| 4,759,603 | 7/1988 | Jones | 350/96.28 |
| 4,767,172 | 8/1988 | Nichols et al. | 355/1 X |
| 4,794,424 | 12/1988 | Higaki | 355/218 |
| 4,796,052 | 1/1989 | Mizutani et al. | 355/218 |
| 4,814,667 | 3/1989 | Tanaka | 362/800 |
| 4,837,598 | 6/1989 | Nonami | 355/218 |
| 4,843,427 | 6/1989 | Ibuchi | 355/218 |
| 4,928,142 | 5/1990 | Kloosterman | 355/228 X |

FOREIGN PATENT DOCUMENTS

| | | | |
|---|---|---|---|
| 62-23072 | 1/1987 | Japan | 355/218 |
| 62-103668 | 5/1987 | Japan | 355/218 |
| 62-103669 | 5/1987 | Japan | 355/218 |
| 62-103670 | 5/1987 | Japan | 355/218 |
| 62-119562 | 5/1987 | Japan | 355/218 |

OTHER PUBLICATIONS

Hewlett–Packard Drawing No. D-5180-6670-1.

*Primary Examiner*—R. L. Moses

[57] ABSTRACT

An erase bar for a xerographic printer, copier or the like has a row of light emitting diodes for illuminating a row of pixels across the photosensitive medium of the printer. Each LED is located in the bottom of a cavity. Next to the bottom of the cavity are concave reflective walls which reflect light emitted transversely from the LED toward an open end of the cavity. Reflective walls of the cavity provide multiple bounces of some of the light. Absorptive walls nearer the open end of the cavity absorb some of the light. These features combine to illuminate a pixel of desired shape and with approximately uniform intensity of illumination. Additional uniformity may be provided by passing the illumination through a window that is at least partly absorbing for smoothing out differences in intensity.

47 Claims, 6 Drawing Sheets

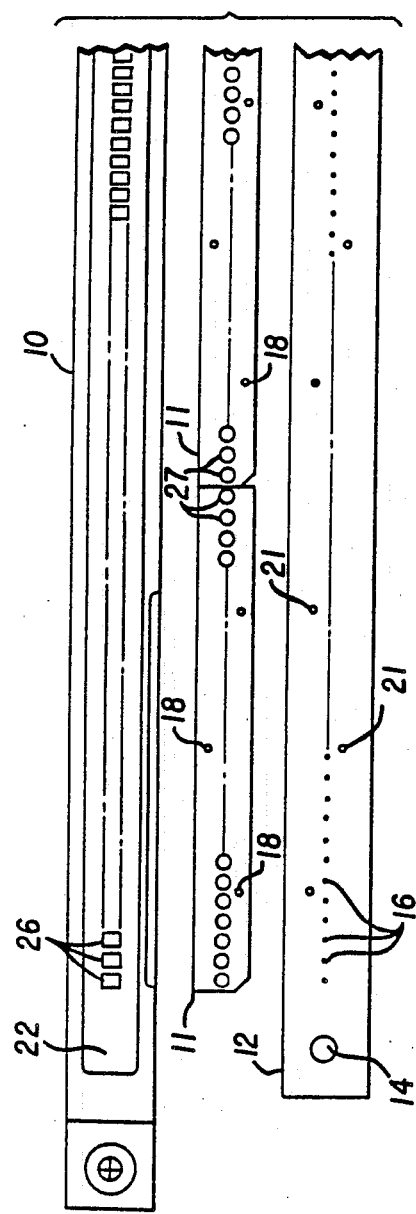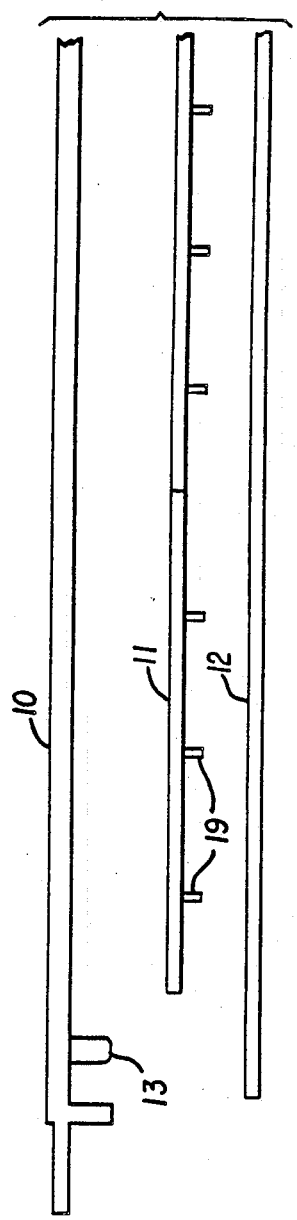

FIG. 9
FIG. 10
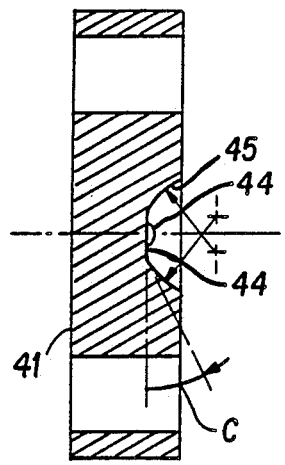
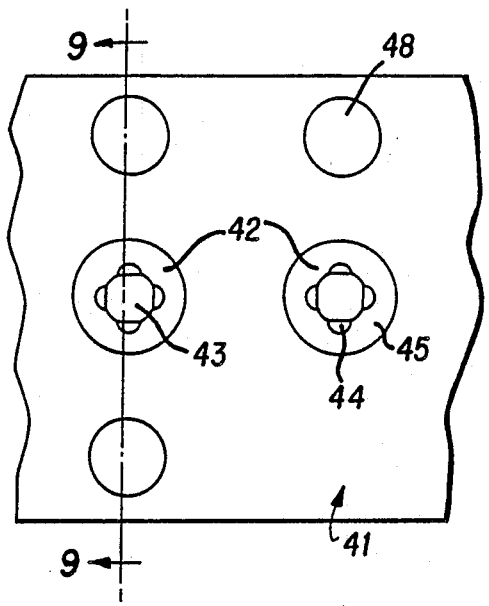
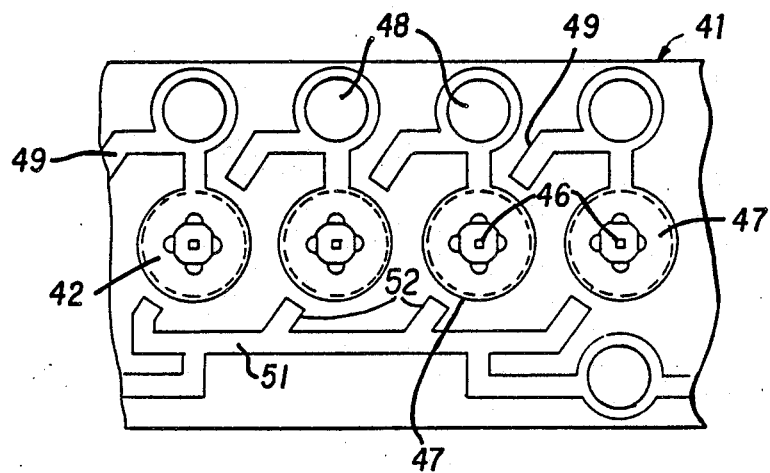
FIG. 11

LED ILLUMINATOR BAR FOR COPIER

BACKGROUND

This invention relates to an illumination or erase bar for a xerographic printer or the like, having a row of light emitting diodes for illuminating an image plane in a stripe having approximately uniform intensity along the length of the stripe.

There are times when it is desirable to illuminate a selected area on a photosensitive surface in a xerographic device such as a printer, copier, scanner, facsimile machine, or the like. For example, the entire breadth of the medium may be illuminated as it moves along after transferring an image to paper, for completely discharging the medium so that it is in a uniform ground state to be charged for receiving a new image. The entire breadth of the medium may be bathed in light of reasonably uniform intensity for this total erasure.

There are other times when it is desirable to illuminate a selected area on the medium. This might be done, for example, to block out text or, in a color printer, to paint in background color. It might be used, for example, in a color printer, to block out the area of a letterhead on a document so that the letterhead is printed in color and the text of the letter is printed in black. A more sophisticated erase bar is needed for such selective illumination.

Such an illumination bar may illuminate two or three millimeter long segments or pixels of a stripe a two or three millimeters wide. Each of these pixels is illuminated by a separate light emitting diode (LED). Each of the LEDs can be separately addressed or switched for illuminating a desired area on the medium. It is still important to obtain reasonably uniform illumination within the area being illuminated; typically, an intensity difference of about two to one between the brightest and dimmest areas is acceptable. Sometimes tighter specifications for differences in illumination are required. This means that the illumination within each pixel must be reasonably uniform. It also means that there cannot be gaps between adjacent pixels.

Typically, one seeks to achieve an intensity of illumination across a pixel in the direction of the length of the row or stripe which is approximately trapezoidal. Over the major portion of the length of the pixel, the intensity is reasonably uniform. At each edge, intensity drops off rapidly with distance toward a dark area surrounding the pixel. It is undesirable to have a halo of light surrounding the illuminated pixel. Adjacent pixels in the row are arranged so that the decreasing illumination of one pixel overlaps the increasing illumination of the next pixel, preferably with the overlap making the two 50% intensity levels of adjacent pixels at the same location. This avoids any gap in illumination, any significant decrease in illumination between adjacent pixels, and any significant increase in illumination due to excessive overlap.

Bubble lenses and the like have been used for projecting the light from an LED toward an image plane for providing individually illuminated pixels. Lens systems are, however, costly and somewhat inefficient in transmitting light from the LED to the image plane. In a typical system, only about 20% of the light from the LED may be usefully projected on the image plane. Defects in an LED or misalignment of an LED may also be projected toward the image plane, thereby degrading the uniformity of light within a pixel. For example, a chipped corner on an LED may show up in the image plane as a significant change in illumination. Another difficulty with lens systems is a limited depth of field. A belt carrying the photosensitive medium may "flap" somewhat, varying the distance between the erase bar and the medium. With a lens system this can change the shape and size of the illuminated pixel as the medium moves in and out of focus.

It is, therefore, desirable to provide an individually addressable LED illuminator bar which is less costly and more efficient than a lens system. It is desirable that the system be tolerant of LED defects. It is desirable that the intensity of illumination be approximately uniform across each pixel and between pixels, so that a uniform intensity illumination is obtained across the full length of the illuminator bar, across any subset of pixels, and across each individual pixel.

An exemplary illuminator bar and some prior techniques for illumination are described and illustrated in U.S. Pat. No. 4,759,603 by Jones. In the arrangement described therein, there is appreciable absorption of light. It would be desirable to provide an LED illuminator bar with higher efficiency.

BRIEF SUMMARY OF THE INVENTION

There is, therefore, provided in practice of this invention according to a presently preferred embodiment an illumination bar for a xerographic printer, or the like, having a plurality of light sources in a row for approximately uniformly illuminating separate areas along the length of the row. Each of the light sources on the illumination bar is in the form of a cavity open at the end facing in the direction of illumination and closed at the opposite end. A light emitting diode at the closed end of the cavity emits radiation in directions transverse to the direction of illumination. A concave reflective wall at the closed end of the cavity reflects a major portion of the light emitted by the light emitting diode in a direction toward the open end of the cavity. Occultation means are provided near the open end of the cavity for defining the image shape of that pixel. In a preferred embodiment the means for defining the shape of the image comprises absorptive walls adjacent to the open end of the cavity.

Alternatively, a faceted or conical reflector may be used at the closed end of the cavity with absorptive walls for defining the shape of the image projected from the cavity.

If desired, a window may be provided over the open end of the cavity, which is at least partially absorbing in a pattern for obtaining a desired illumination intensity pattern from the cavity. In an exemplary embodiment, such an illumination bar may be assembled from a plurality of layers of different geometries and surface properties.

DRAWINGS

These and other features and advantages will be appreciated as the same becomes better understood by reference to the following detailed description when considered in connection with the accompanying drawings, wherein:

FIG. 1 is a fragmentary top view of three pieces used to assemble an illumination bar, offset laterally from each other so that the relation of the parts, as assembled, can be seen;

FIG. 2 is a side view of the parts in FIG. 1 exploded from each other;

FIG. 9 is a transverse cross-section of a deflector plate of another embodiment of illumination bar;

FIG. 10 is a fragmentary front face view of the illumination bar of FIG. 9;

FIG. 11 is another view of the front face of the illumination bar of FIG. 9, showing additional detail;

DESCRIPTION

Figure 3:
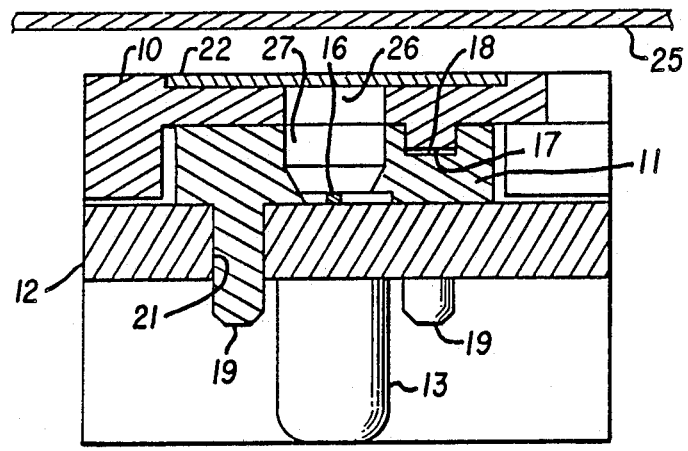
FIG. 3 is a transverse cross-section of the assembled illumination bar adjacent to a photosensitive medium.

An exemplary illumination bar is conveniently assembled as a sandwich of three strips or elongated plates as illustrated in FIGS. 1 to 3. The top or front strip is an aperture plate 10 which, in this embodiment, is made of an absorptive black polycarbonate plastic. The middle layer of the sandwich is a deflector plate 11 which, in this embodiment, is preferably made of a reflective white polycarbonate plastic. Colors are imparted to the plastic by pigments such as carbon or $TiO_2$. Preferably, the aperture plate and deflector plate are made of the same thermoplastic material, so that they can be ultrasonically welded together.

It is convenient to form the deflector plate in a series of strips shorter the aperture plate, which are then assembled in controlled locations on the back side of the aperture plate.

The third layer in the sandwich forming the illumination bar is a printed circuit board 12, which forms the back of the sandwich. After assembling the deflector plate or plates on the back of the aperture plate, the printed circuit board is fastened to the aperture plate. A pair of posts 13 on the back of the aperture plate extend through holes 14 through the printed circuit board, thereby aiding alignment of the aperture plate and printed circuit board.

It will be recognized that only one end of the parts making up an illumination bar are illustrated in FIGS. 1 and 2. Such a bar has an overall length sufficient for illuminating the medium to be used in a printer or the like. Thus, for example, the length of the active region of the erase bar could be a little over 216 millimeters for a printer handling standard 8½ inch wide or smaller paper. The erase bar may be made longer as desired for handling wider paper.

The sandwich is assembled from two subassemblies. One of these is the printed circuit board with a row of light emitting diodes (LEDs) 16 mounted thereon. The other subassembly comprises the aperture plate 10 with one or more deflector plates 11 bonded thereto. Since careful alignment is important to obtain good optical quality, a plurality of short studs 17 on the back of the aperture plate (hidden in FIG. 2) fit into shallow pits 18 on the front of the deflector plate or plates. Small triangular ridges (not shown) may be left on one of the facing surfaces for ultrasonically welding the deflector plates to the aperture plate.

When these two subassemblies have passed inspection, they are assembled with the posts 13 extending through the holes 14. In addition, pins 19 on the back of the deflector plate extend through holes 21 through the printed circuit board. The protruding ends of the pins 19 are heat staked to fasten the sandwich assembly together. A clear polycarbonate protective window 22 extends along the front face of the aperture plate. The window can be added before or after the sandwich is assembled.

Figure 7:
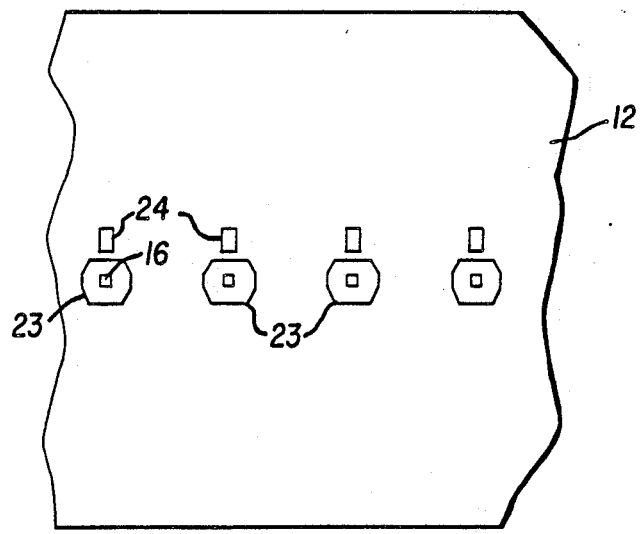
FIG. 7 is a fragmentary top view of a printed circuit board from the embodiment of FIGS. 1 to 3.

A row of LEDs 16 is assembled in the center of each of a row of metallized pads 23 on the front face of the printed circuit board (FIG. 7). The pad serves as one electrical contact for the light emitting diode. The second electrical connection (not shown) is made by wire-bonding from the top of the LED to an adjacent rectangular contact pad 24.

The LEDs are conventional, as are their connections. In an exemplary embodiment, such an LED may be 0.25 millimeter square and have a thickness of 0.2 millimeter. The electrical connection to the top of such an LED may be a 25 micrometer wire bonded to a 75 micrometer spot on the LED. Preferably, the LEDs are transparent side emitting LEDs; that is, part of the light is emitted from the top face of the LED and a major portion of the light is emitted laterally. Thus, for example, in an exemplary embodiment, a green emitting LED may be used, which emits light from the top as well as the sides. Such side-emitting diodes are desirable since they are more efficient than top-emitting diodes.

The aperture plate has a row of apertures 26 extending along its active length. In the illustrated embodiment, each aperture is substantially rectangular with somewhat rounded corners. The walls of the aperture form a rectangular cylinder. In an exemplary erase bar, the apertures are on 2.5 millimeter centers and have an opening 1.8 by 2.0 millimeters.

Figure 6:
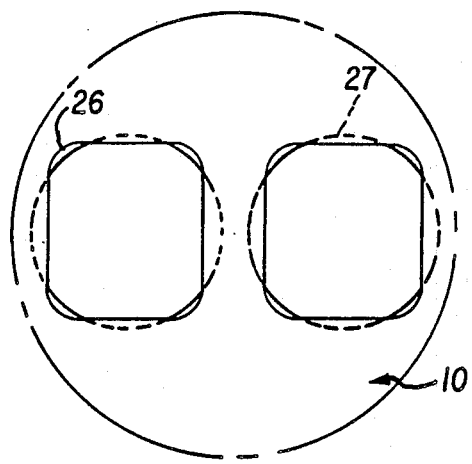
FIG. 6 is a top view of a fragment of the aperture plate of FIGS. 1 to 3 also indicating a fragment of the underlying deflector plate.

A row of passages 27 extend through the deflector plate 11. The sandwich is aligned so that each passage is aligned with a respective aperture through the aperture plate as seen in FIG. 6 which is a face view of a fragment of the aperture plate overlying the deflector plate. Similarly, each LED on the printed circuit board is centered in a respective passage through the deflector plate. Collectively, such a passage and aperture form a cavity which is closed at its bottom end by the printed circuit board and is open (for emission of light) at the window end of the aperture. There is an LED at the closed end of each such cavity. Each such cavity serves as a light source illuminating a separate area along the length of an assembled erase bar; that is, each cavity illuminates one pixel in an image plane in front of the window.

Typically, the photosensitive medium 25 (FIG. 3) moving past the cavity is about a millimeter away from the aperture end of the cavity. By adjusting the dimensions and concave surfaces in the cavity, there may be distances of up to five millimeters between the end of the cavity and the photosensitive medium. Within such distances, the image shape projected from the aperture at the end of the cavity directly onto the photosensitive surface retains a shape similar to the shape of the aperture without use of any lenses. This direct projection from the cavity has a better depth of field than when lenses are used for focussing the light; hence, less precision is needed in spacing the medium and light source. Further, there is no need for careful alignment of lenses.

The passage through the deflector plate has a front portion extending about half of the thickness of the plate in the form of a right circular cylinder 28. In one embodiment the passage has a diameter of 2.1 millimeters. At the opposite end of the passage; that is, at the closed end of the cavity adjacent the printed circuit board, there is a surface 29 in the form of a relatively shallower cone. Between the conical surface 29 and the right circular cylindrical walls 28, there is a second somewhat steeper conical surface 31. The two conical surfaces form a concave reflective wall which reflects light from the LED toward the open end of the cavity.

In an exemplary embodiment, the shallower cone near the closed end of the cavity has a total included angle B of 82°. The somewhat steeper cone 31 has a total included angle A of 60°. The total depth of the passage is 1.6 millimeters. It will be recognized that these exemplary dimensions are for a specific embodiment to obtain an acceptable light distribution and intensity for illuminating a pixel of desired dimensions. The specifics of a cavity are determined by the properties desired in the product and are affected by other equipment parameters such as the properties of the photosensitive medium, the pixel area, the speed of the medium moving past the erase bar, the distance between the cavity and the medium, and the like.

The die for injection molding the deflector plate is highly polished so that the conical surfaces 29 and 31 and the cylindrical surface 28 are also polished. The smooth, white plastic surface provides excellent reflection of the light emitted laterally from the light emitting diode toward the image plane beyond the open end of the cavity. Reflectivity may be enhanced, if desired, by metallizing such surfaces. However, good efficiency of utilization of light is obtained without need for metallizing. Efficiency can easily be twice the efficiency of an illumination system using a lens.

The concave reflector formed by the two conical surfaces in combination with the metallized pad on the printed circuit board proves quite effective in directing light from the LED approximately uniformly across the pixel illuminated by the cavity. Other concave reflective walls might be used, but it has not proved important to make parabolic or elliptical reflectors for collimating light from the cavity. That may not even be feasible since the LED is a rather large area light source, rather than a point source.

Figure 4:
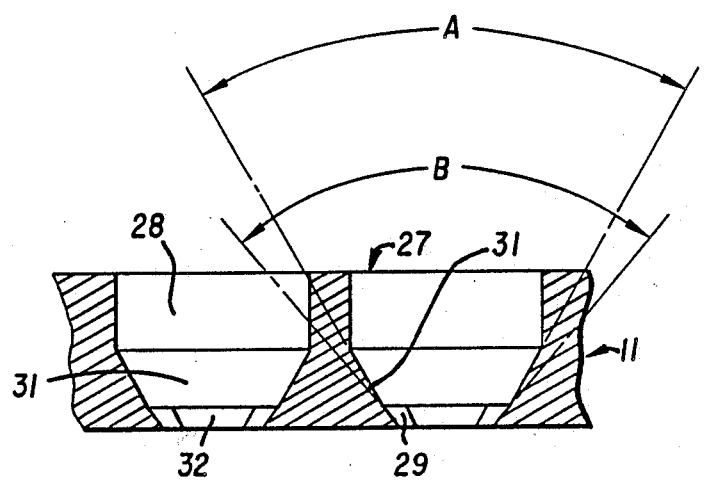
FIG. 4 is a fragmentary longitudinal cross-section of the deflector plate from the middle of the assembly illustrated in FIGS. 1 to 3.
Figure 5:
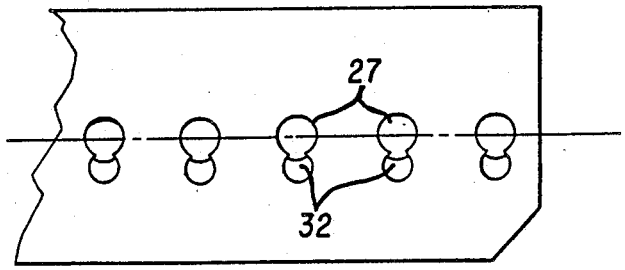
FIG. 5 is a back or bottom view of a fragment of the deflector plate.

In this context, "concave" is used in the sense of having concavity in a longitudinal cross section through the cavity, such as seen in FIGS. 3 and 4. A single conical surface in the closed end of the cavity could be considered concave in a transverse cross section.

Further, this arrangement of reflective surfaces tends to throw light throughout the area of the open end of the cavity and is quite insensitive to defects in the LED or moderate misalignment or mispositioning of the LED. Ray traces show one or two bounces of the light off the reflective walls. There is some light going directly from the LED toward the open end of the cavity with no bounces and a very minor part with three bounces. Most of the scrambling of the light comes from a single bounce of the light off the concave walls of the cavity. Since the angles of the walls vary by reason of the concavity, there is a tendency to promote substantial uniformity of light intensity across the pixel illuminated by the cavity.

A shallow counterbore 32 is provided on the back face of the deflector plate to provide clearance for the wire bond connection between the rectangular pad 24 on the PC board and the top of the LED. Although the counterbore interrupts a portion of the circumference of the shallower cone 29 near the bottom of the cavity, there is ample scrambling of the light by reflections off the concave walls that the illumination is approximately uniform across the pixel and the shadowed area is not significant.

Further, the shadow of the contact wire and the pad to which it is bonded do not appear to affect the uniformity of illumination. This may be contrasted with a lens system where such artifacts could significantly degrade the uniformity of illumination across the pixel. Further, since a major portion of the light from the LED is directed toward the open end of the cavity by the concave reflective walls in the closed end of the cavity, high efficiency is obtained. It appears that the efficiency of illumination for a given power to the LEDs for a system as provided in practice of this invention is at least twice as high as the efficiency of a system employing lenses for illuminating the pixels.

The black walls of the substantially rectangular aperture through the aperture plate tend to absorb a major part of the radiation striking the walls at high angles of incidence. Light striking at low angles of incidence is retained in the cavity and helps provide uniformity of illumination. By absorbing light that is not directed out of the cavity at a low angle from its axis, the absorbent walls minimize any halo of light around the illuminated pixel.

By making the aperture at the open end of the cavity rectangular, it serves as an occultation mask for defining a generally rectangular image shape. By clipping or rounding the corners of the rectangle, the drop-off of light intensity at the edge of the pixel along the length of the stripe can be controlled so that the average light intensity where pixel edges overlap can be maintained with approximate uniformity. The aspect ratio of the rectangular opening of the cavity may be varied as desired to obtain a desired image shape. The projected image may be square, or rather elongated either transverse to or along the photosensitive medium. The rounding or clipping of the corners for shaping the projected image can be varied through a considerable range.

If desired, the absorption by the walls of the aperture may be enhanced by roughening. This could also diffuse reflected light and enhance uniformity of illumination. No special effort was made to roughen the walls and, although they appear somewhat shiny, they have proved effective as absorbers. Rather than being a rectangular cylinder, the absorbing walls could also be in the form of a prism converging slightly toward the open end of the cavity.

Reflective walls may also be used for occulting part of the light from the cavity and shaping the projected image. White reflective walls are not as effective as black absorptive walls in defining a sharp edge on the image. Metallizing the walls to make them highly reflective may be used for enhancing image sharpness.

When reflective walls are used it may also be desirable to taper the walls so they converge slightly toward an aperture at the open end of the cavity having a shape similar to the shape of the image it is desired to project.

Figure 8:
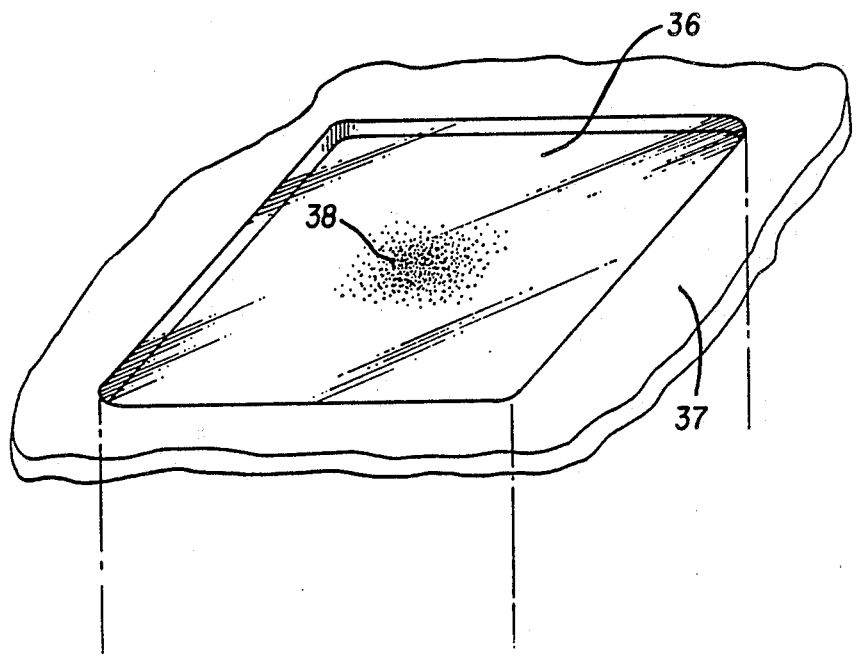
FIG. 8 is an isometric view of an exemplary window which may be used on an illumination bar.

Because of the high efficiency obtained with the reflective concave cavity, an additional technique may be employed, if desired, for assuring uniformity of illumination. A pattern may be provided on the transparent window at the open end of the cavity for selectively absorbing light, as well as shaping the image. FIG. 8 illustrates such an embodiment.

In such an embodiment, a generally rectangular area 36 of the window over a cavity is surrounded by an opaque area 37. The perimeter of the transparent area may serve as a shadow mask helping to define the edges of the pixel. Further, if need be, an area 38, indicated by a stippling in the drawing, where light intensity would otherwise be too high, can be made partially absorbing for reducing light intensity.

The partially absorbing area may be produced by any of a variety of conventional techniques. For example, a pattern of fine dots of varying size or density may be used in the manner of a half-tone screen to occult more or less area as desired. A photographic emulsion may also be selectively darkened to be partially absorbent. Alternatively, opaque bands or other patterns of partly or totally absorbing areas may be used to cast somewhat darkened shadows on the image plane and make the resultant illumination more uniform. For example, an opaque band may be placed across the center of the aperture if the central illumination is too bright. The scrambling of the light within the pixel illuminates the area behind the band with an intensity near the average intensity throughout the pixel.

Alternatively, a partially absorbing area may be made on an ad hoc basis by incorporating a photochromic material in the window. In such an embodiment the window selectively darkens in response to different intensities of illumination. In areas with higher light intensity, the window gets darker or more absorbent than in areas with less illumination. As a consequence, the light transmitted through the window is made more uniform.

FIGS. 9 to 11 illustrate part of another embodiment of illuminating cavity constructed according to principles of this invention. In these drawings, the concave reflective walls at the closed end of such a cavity are illustrated. It will be understand that additional reflective and/or absorbing walls are employed for completing the cavity from which light is projected.

In this embodiment, it is as if the concave reflective walls of the deflector plate are combined with the flat reflective surface on the front face of the printed circuit board. Thus, the printed circuit board 41 has a row of concave pits 42 in the front face. The bottom of each pit has a flat central area 43 which has around it four equally spaced arcuate lobes 44. The lobes are not in the same plane as the flat bottom of the pit. They are tilted away from the flat bottom at an angle C, which may be in a range of from 25 to 30 degrees.

The concave walls 45 of each pit are, in cross-section, two circular arcs, the centers of which are on opposite sides of the center line of the pit. These continuous complex curved walls tend to reflect light from a light emitting diode 46 in the bottom of the pit (FIG. 11) toward the open end of a cavity for illuminating a pixel. Additional reflective and/or absorptive walls (not shown) provide additional reflections for obtaining approximate uniformity of illumination and absorption for defining a desired shape and size of pixel.

The four lobes at the bottom of the pit cut into the curved walls to a small extent, thereby diminishing the concave area from which light is reflected. Light is reflected, however, from the portion of the curved walls between the lobes. The result is a pattern of light distribution, which tends to fill in the corners of the illuminated pixel, thereby assuring uniform light distribution. The angled floors of the lobes also reflect light toward the open end of the cavity to combine with light reflected from the curved concave walls and provide uniform illumination.

The substrate having the reflective pits also serves as a printed circuit board for making connections to the light-emitting diodes. The walls and bottoms of the pits are metallized. The metal layer 47 from each pit extends onto the front surface of the board and laterally in one direction to a plated-through hole 48 for making connection to printed circuits (not shown) on the back of the board. A tab 49 on each metallized area provides a means for making a wire bonded connection to the top of the LED in the next pit along the row. These connections may be used when connecting the LEDs in series for illuminating an entire photosensitive medium.

A metallized stripe 51 extends along the opposite edge of the board. When it is desired to make separate electrical connections for each LED for illuminating only selected areas of the photosensitive medium, an electrical connection can be wire bonded between a tab 52 on this stripe and an adjacent LED. This provides means for making electrical contact with each LED along the illumination bar for individually energizing each LED separately from the other LEDs. It will be noticed that with this pattern of printed circuits on the board, this is a "generic" board which can be used for either parallel or series connection of LEDs as may be desired.

The metallized areas may be made by a conventional technique such as electroless deposition of copper, masking and etching, and electroplating with soft gold, for example. All that is needed is that the plating throws adequately into the pits to assure good electrical contact. Such gold metallized concave walls in the pits are highly reflective and provide efficient sources of illumination.

Figure 12:
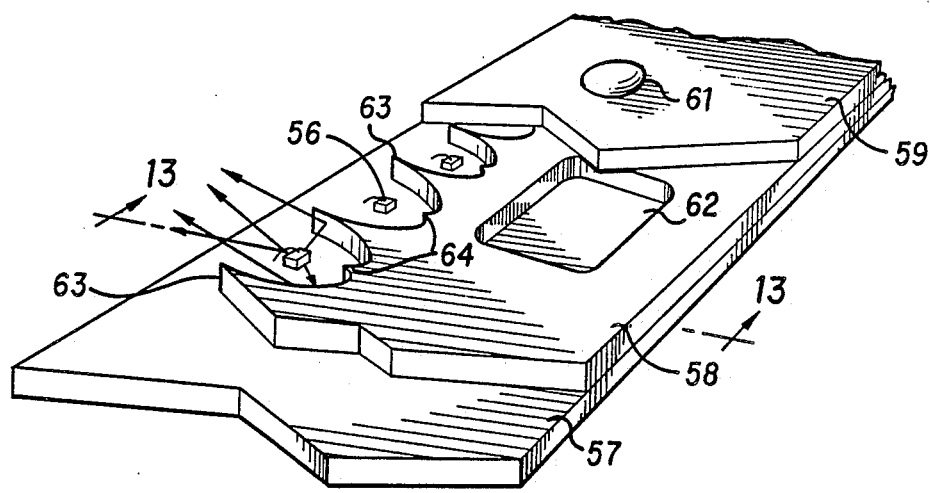
FIG. 12 is a perspective cut-away view of another embodiment of illumination bar.
Figure 13:
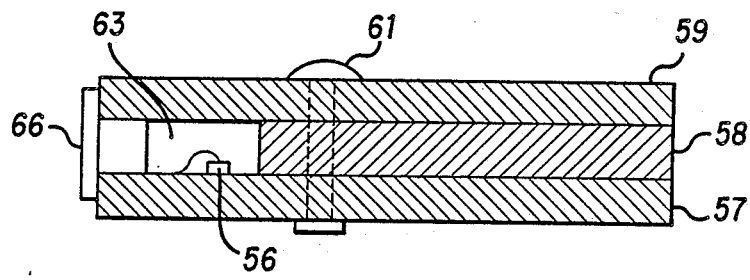
FIG. 13 is a transverse cross-section of the illumination bar of FIG. 12.

FIGS. 12 and 13 illustrate a fragment of another embodiment of illumination bar or erase bar for use in a xerographic printer or the like. This embodiment is particularly useful in a location where space is at a premium. A very narrow stripe can be made, where each pixel extends a substantially greater distance along the length of the stripe than the width of the pixel across the stripe. In this embodiment, a row of side-emitting LEDs 56 are mounted on one face of a printed circuit board 57. Conventional electrical conductors are printed on the board for making electrical contacts with the LEDs. These are omitted from the drawing for clarity of illustration.

A reflector plate 58 is mounted on the front face of the PC board and this, in turn, is covered by a cover plate 59. This three-layer sandwich is held together by fasteners 61. If desired, cut-outs 62 can be made in the reflector plate so that additional components can be mounted on the printed circuit board. The reflector plate may be made of reflective white plastic, or the reflecting surfaces may be metallized to enhance reflection.

The front edge of the reflector plate is scalloped by a row of concave indentations. Each LED is positioned in one of the indentations. Between each adjacent indentation, there is a converging wall 63. Each indentation is in the form of a pair of curved walls, which may, for example, be approximately parabolic or elliptical and have centers offset from the center of the indentation. Thus, where the two curved walls intersect in the center of the indentation, there is a small cusp 64 behind the LED.

Light from the side-emitting LED is reflected from the concave reflective walls of the reflector plate and directed toward the open end of the cavity formed by the indentations and the parallel walls of the printed circuit board and the cover plate, as indicated by a few arrows in FIG. 12. Since the walls are roughly parabolic, they approximately collimate the light projected from the cavity. It is desirable, however, that there be some multiple bounces of light off of the walls for scrambling the light and providing a reasonably uniform intensity of illumination along the length of the assembly.

The faces of the printed circuit board and cover plate bounding two sides of the cavity are largely non-reflective, thereby assuring a narrow stripe of illumination. A transparent window 66 along the front edge of the assembly protects the LEDs and reflective surfaces within the cavities. If desired, the window may be made slightly convex for broadening the image projected from the cavity.

If desired, a portion of the walls 63 between adjacent cavities can be made non-reflective. They may also be extended beyond the location illustrated in FIGS. 12 and 13 for further minimizing cross-talk between adjacent pixels and enhancing uniformity of the illumination. Toward that same end, partially absorbing areas may be provided on the window 66.

Figure 14:
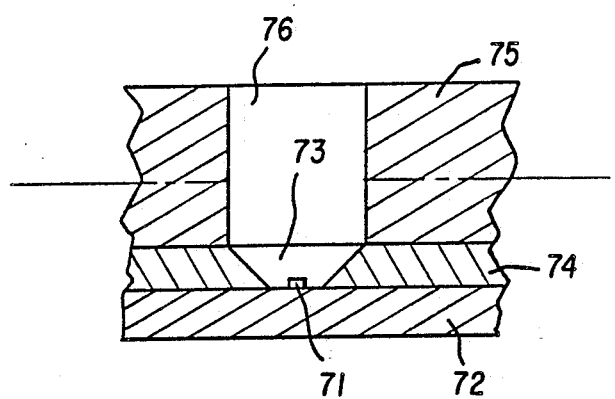
FIG. 14 is a longitudinal cross section of another shape of cavity.

FIG. 14 illustrates in longitudinal cross section another embodiment of cavity constructed according to principles of this invention. In this embodiment an LED 71 is mounted on a printed circuit board 72. This is surrounded by a passage 73 through a deflector plate 74. The passage is in the form of a pyramid with four flat reflective walls at an angle from the plane of the printed circuit board in the order of 45°. Over the deflector plate is an aperture plate 75 which has a generally square aperture 76 aligned with the base of the pyramidal passage 73. The walls of the aperture are absorptive.

Light from the LED 71 reflects off the flat facets or walls of the passage and toward the open end of the cavity. The absorptive walls of the aperture define the shape of the image projected from the cavity. Alternatively, there could be reflective walls from the base of the pyramidal passage part way to the open end of the cavity, as indicated by a phantom line 77, with the balance of the distance to the open end of the cavity being absorptive walls for defining the image shape.

A rather similar embodiment, which would appear in longitudinal cross section similar to FIG. 14, has a conical reflective passage through the deflector plate for reflecting light from the LED toward the open end of the cavity. A conical reflective wall may fill the corners of a generally rectangular aperture with more uniform intensity of illumination than a passage with four flat reflective walls. Alternatively, four flat facets may be provided in the corners of an otherwise pyramidal passage for enhancing reflection of light toward the corners of a rectangular absorptive aperture. The corners of such an aperture can, of course, be rounded or clipped as mentioned above. In each of such embodiments the reflective walls at the closed end of the cavity are straight in a longitudinal cross section instead of concave. The straight reflective walls are at an angle to the longitudinal axis of the cavity for reflecting light toward the open end of the cavity.

Although limited embodiments of illumination or erase bar have been described and illustrated herein, many modifications and variations will be apparent to one skilled in the art. Thus, although specific materials, LEDs and the like have been mentioned, it will be apparent that these are merely exemplary. The particular shapes of the cavities may be the product of balancing variations in length, width, and other parameters of the cavities and LEDs to achieve a desired illumination efficiency and illumination distribution. Conical and complex curved walls (that is, curving in more than two dimensions) have been specifically mentioned, however, it will be apparent that other concave surfaces may be employed. A plurality of facets would be an example. It is, therefore, to be understood that, within the scope of the appended claims, the invention may be practiced otherwise than as specifically described.

What is claimed is:

1. An illumination bar for a xerographic printer or the like comprising:
    a plurality of light sources in a row, each light source illuminating a separate area along the length of the illumination bar, adjacent illuminated areas being located so that the illumination along the length of the illumination bar is approximately uniform; each of the light sources comprising:
    a cavity open at an end facing in the direction of illumination by the illumination bar and closed at the opposite end;
    a light emitting diode at the closed end of the cavity for emitting radiation in directions transverse to the direction of illumination by the illumination bar;
    a concave reflective wall at the closed end of the cavity for reflecting a major portion of the light emitted by the light emitting diode in a direction toward the open end of the cavity; and
    occultation means between the reflective walls and the open end of the cavity for defining the shape of an image projected from the open end of the cavity.

2. An illumination bar as recited in claim 1 wherein the means for defining an image shape comprises at least partly absorbing walls between the reflective walls and the open end of the cavity.

3. An illumination bar as recited in claim 1 wherein the means for defining an image shape comprises reflective walls having an aperture shape at the open end of the cavity similar to the shape of the projected image.

4. An illumination bar as recited in claim 1 wherein the concave reflective wall comprises a first relatively shallower cone nearer the closed end of the cavity and a second relatively steeper cone further from the closed end of the cavity.

5. An illumination bar as recited in claim 1 wherein the concave reflective wall comprises a continuous complex curve.

6. An illumination bar as recited in claim 1 further comprising a window over the open end of the cavity which is at least partially absorbing in a pattern for obtaining a desired illumination intensity uniformity from each cavity.

7. An illumination bar as recited in claim 1 further comprising a window over the open end of the cavity which includes a photochromic material for selectively darkening in response to differences in illumination.

8. An illumination bar as recited in claim 1 wherein at least the concave end of the cavity is metallized and the light emitting diode is a side emitting light emitting diode mounted on the metallized area.

9. An illumination bar as recited in claim 1 wherein the cavity has opposite parallel side walls and the light emitting diode is mounted on one parallel side wall of the cavity between the concave closed end and the open end.

10. An illumination array comprising:
a plurality of cavities in a row, each cavity being closed at one end and open at the other end for projecting light toward an image plane, and comprising:
a reflective closed end including a portion angled for reflecting light from the closed end toward the open end of the cavity,
a cylindrical absorptive wall at the open end, and
a cylindrical reflective wall between the absorptive wall and the concave closed end; and
a light emitting diode mounted at the bottom of the closed end of each cavity.

11. An array as recited in claim 10 wherein the closed end comprises a flat bottom on the cavity, a first shallower cone adjacent the flat bottom and a second steeper cone between the first cone and the reflective cylindrical wall.

12. An array as recited in claim 10 wherein the cylindrical reflective wall is a right circular cylinder, and the cylindrical absorptive wall is a generally rectangular cylinder.

13. An array as recited in claim 10 further comprising a partially absorptive window at the open end of the cavity for absorbing a portion of the light from the cavity in selected areas of the window for obtaining a desired uniformity of illumination intensity.

14. An array as recited in claim 13 wherein each window includes a photochromic material for selectively darkening in response to differences in illumination.

15. An illumination bar as recited in claim 10 wherein the angled reflective wall is straight in a longitudinal cross section through the cavity.

16. An illumination bar as recited in claim 10 wherein the angled reflective wall is concave in a longitudinal cross section through the cavity.

17. An illumination bar as recited in claim 10 further comprising means for making electrical contact with each LED along the illumination bar for individually energizing each LED separately from the other LEDs.

18. An array as recited in claim 10 wherein at least the closed end of the cavity is metallized and the light emitting diode is a side emitting light emitting diode mounted on the metallized area.

19. An illumination bar for a xerographic printer or the like comprising:
a printed circuit board;
a plurality of light emitting diodes mounted in a row on the printed circuit board;
a deflector plate mounted on the printed circuit board;
a row of passages through the deflector plate, each passage being around a light emitting diode on the printed circuit board and having reflective walls concave in a direction away from the printed circuit board for reflecting light from the light emitting diode away from the printed circuit board;
a aperture plate mounted on the deflector plate;
a row of apertures through the aperture plate, each aperture being aligned with a passage through the deflector plate for passing light from the light emitting diode toward an image plane beyond the aperture plate.

20. An illumination bar as recited in claim 19 wherein each light emitting diode is a side emitting light emitting diode.

21. An illumination bar as recited in claim 19 wherein the walls of the apertures are absorptive.

22. An illumination bar as recited in claim 19 wherein each passage through the deflector plate includes a cylindrical wall between the concave walls and the aperture plate.

23. An illumination bar as recited in claim 19 wherein the reflective walls in the deflector plate comprise a first relatively shallower cone nearer the printed circuit board and a second relatively steeper cone further from the printed circuit board.

24. An illumination bar as recited in claim 19 wherein the passage through the deflector plate comprises a circular opening, and the aperture through the aperture plate comprises a rectangle.

25. An illumination bar as recited in claim 19 further comprising a window over the aperture.

26. An illumination bar as recited in claim 25 wherein the window is partially absorbing in a pattern for obtaining a desired illumination intensity uniformity from each cavity.

27. An illumination bar as recited in claim 25 wherein the window includes a photochromic material for selectively darkening in response to differences in illumination.

28. An illumination bar for a xerographic printer or the like comprising means for projecting a stripe of light formed of a plurality of adjacent generally rectangular pixels, each means for projecting comprising:
a cavity with a generally rectangular aperture at one end of the cavity;
a reflective concave closed end at the other end of the cavity; and
a light emitting diode mounted in the closed end for emitting light toward at least the concave portion of the cavity.

29. An illumination bar as recited in claim 28 wherein the cavity has opposite parallel side walls and the light emitting diode is mounted on one parallel side wall of the cavity between the concave closed end and the open end.

30. An illumination bar as recited in claim 28 wherein the concave reflective end comprises a first relatively shallower cone nearer the closed end of the cavity and a second relatively steeper cone further from the closed end of the cavity.

31. An illumination bar as recited in claim 28 wherein the concave reflective end comprises a continuous complex curve.

32. An illumination bar as recited in claim 28 further comprising means for making electrical contact with each LED along the illumination bar for individually energizing each LED separately from the other LEDs.

33. An illumination array comprising:
   a printed circuit board;
   a row of light emitting diodes mounted on the printed circuit board;
   a reflector plate on the printed circuit board including a scalloped edge with a row of indentations, each indentation encompassing a light emitting diode, each indentation having a reflective concave wall portion for reflecting light from the light emitting diode away from the reflector plate; and
   a cover plate over the reflector plate.

34. An illumination array as recited in claim 33 wherein such a concave wall portion is in the form of two continuous curves intersecting in a cusp behind the light emitting diode.

35. An illumination array comprising:
   a printed circuit board;
   a row of pits in the printed circuit board, each pit having walls angled for reflecting light from the bottom of the pit away from the printed circuit board;
   a metal layer on the printed circuit board including a portion adjacent to such a pit and a portion in such a pit; and
   a side emitting light emitting diode on the metal layer in the bottom of such a pit.

36. An illumination array comprising means for illuminating a plurality of adjacent pixels, each means for illuminating comprising a light source having a transparent window, and characterized by each window including a photochromic material for selectively darkening in response to differences in illumination.

37. A xerographic printer or the like comprising:
   a movable photosensitive medium; and
   a plurality of means for projecting a plurality of separately addressable images directly on the photosensitive medium without a lens, each means for projecting comprising:
      a cavity with a generally rectangular aperture at one end of the cavity;
      a reflective concave closed end at the other end of the cavity; and
      a light emitting diode mounted in the closed end for emitting light toward at least the concave portion of the cavity.

38. A xerographic printer or the like as recited in claim 37 wherein the aperture comprises at least partly absorbing walls between the reflective closed end and the open end of the cavity.

39. A xerographic printer or the like as recited in claim 37 wherein the aperture comprises reflective walls having an aperture shape at the open end of the cavity similar to the shape of the projected image.

40. An illumination bar for a xerographic printer or the like comprising:
   a plurality of light sources in a row, each light source illuminating a separate area along the length of the illumination bar, adjacent illuminated areas being located so that the illumination along the length of the illumination bar is approximately uniform; each of the light sources comprising:
      a cavity open at an end facing in the direction of illumination by the illumination bar and closed at the opposite end;
      a light emitting diode at the closed end of the cavity for emitting radiation in directions transverse to the direction of illumination by the illumination bar;
      a reflective wall at the closed end of the cavity for reflecting a major portion of the light emitted by the light emitting diode in a direction toward the open end of the cavity; and
      at least partly absorbing walls between the reflective walls and the open end of the cavity for defining the shape of an image projected from the open end of the cavity.

41. An illumination bar as recited in claim 40 wherein the reflective wall is straight in a longitudinal cross section through the cavity.

42. An illumination bar as recited in claim 40 wherein the reflective wall is concave in a longitudinal cross section through the cavity.

43. An illumination bar as recited in claim 40 further comprising means for making electrical contact with each LED along the illumination bar for individually energizing each LED separately from the other LEDs.

44. An illumination bar for a xerographic printer or the like comprising means for projecting a stripe of light formed of a plurality of adjacent generally rectangular pixels, each means for projecting comprising:
   a cavity with a generally rectangular absorptive walls forming an aperture at one end of the cavity;
   a reflective closed end at the other end of the cavity having a portion angled for reflecting a major part of the light striking the reflective angled portion toward the open end of the cavity; and
   a light emitting diode mounted in the closed end for emitting light toward at least the angled reflective portion of the cavity.

45. An illumination bar as recited in claim 44 wherein the angled reflective wall is straight in a longitudinal cross section through the cavity.

46. An illumination bar as recited in claim 44 wherein the angled reflective wall is concave in a longitudinal cross section through the cavity.

47. An illumination bar as recited in claim 44 further comprising means for making electrical contact with each LED along the illumination bar for individually energizing each LED separately from the other LEDs.

* * * * *